(12) United States Patent
Bahei-Eldin et al.

(10) Patent No.: US 12,214,688 B2
(45) Date of Patent: Feb. 4, 2025

(54) CONTROL UNITS, SYSTEMS, AND METHODS FOR ESTABLISHING RESERVE POWER LIMITS

(71) Applicant: Rivian IP Holdings, LLC, Plymouth, MI (US)

(72) Inventors: Khaled Bahei-Eldin, Irvine, CA (US); Deidre Yiu, San Francisco, CA (US)

(73) Assignee: Rivian IP Holdings, LLC, Irvine, CA (US)

( * ) Notice: Subject to any disclaimer, the term of this patent is extended or adjusted under 35 U.S.C. 154(b) by 543 days.

(21) Appl. No.: 17/564,932

(22) Filed: Dec. 29, 2021

(65) Prior Publication Data

US 2023/0202329 A1 Jun. 29, 2023

(51) Int. Cl.
*H02J 7/00* (2006.01)
*B60L 53/62* (2019.01)
*B60L 53/66* (2019.01)
*G01R 31/382* (2019.01)

(52) U.S. Cl.
CPC ............ *B60L 53/62* (2019.02); *B60L 53/66* (2019.02); *G01R 31/382* (2019.01)

(58) Field of Classification Search
None
See application file for complete search history.

(56) References Cited

U.S. PATENT DOCUMENTS

| | | | | |
|---|---|---|---|---|
| 2007/0069734 A1* | 3/2007 | Bertness | ............. | H02J 7/00047 324/411 |
| 2014/0055087 A1* | 2/2014 | Causey | ................... | H02J 50/10 320/108 |
| 2019/0288519 A1* | 9/2019 | Takei | ...................... | G06F 1/266 |
| 2022/0381844 A1* | 12/2022 | Tseng | ................... | G01R 31/392 |

\* cited by examiner

*Primary Examiner* — Arun C Williams
(74) *Attorney, Agent, or Firm* — Foley & Lardner LLP

(57) ABSTRACT

Various disclosed embodiments include illustrative control units, systems, and methods. In an illustrative embodiment, a control unit includes a processor and computer-readable media that stores computer-executable instructions. The instructions cause the processor to establish a reserve level for a battery of a first device. The reserve level provides sufficient electrical power to enable the device to achieve a function. The instructions further cause the processor to enable the battery to function as a power supply configured to provide electrical power for a second device external to the first device responsive to a power level of the battery exceeding the reserve level and to disable use of the battery as the power supply for the second device responsive to the power level of the battery being below the reserve level.

15 Claims, 5 Drawing Sheets

CONTROL UNITS, SYSTEMS, AND METHODS FOR ESTABLISHING RESERVE POWER LIMITS

The present disclosure relates to electric vehicle charging systems. The statements in this section merely provide background information related to the present disclosure and may not constitute prior art.

During a power outage, the battery of a vehicle electrically connected to an electrical system of a structure, such as a residential building or a business building, can be used as a backup power source for electrical loads of the structure. However, if the power outage last for significant amount of time, the electrical loads could drain the connected vehicle's battery. A drained battery would limit the ability to drive the vehicle to a destination or to a powered charging device outside of the power outage area or powered by a non-grid source power.

BRIEF SUMMARY

Various disclosed embodiments include illustrative control units, systems, and methods.

In an illustrative embodiment, a control unit includes a processor and computer-readable media that stores computer-executable instructions configured to cause the processor to determine one or more reserve levels for a battery. The one or more reserve levels provide electrical power to enable a first device, such as a vehicle, to perform one or more functions, such as enabling the vehicle to reach a given destination. The instructions further cause the processor to enable the battery to provide electrical power to a second device, such as a second vehicle or a home, responsive to a power level of the battery reaching the reserve level. The instructions further cause the processor to disable the battery from providing the electrical power to the second device responsive to the power level of the battery being meeting or falling below the reserve level.

In an illustrative embodiment, a control unit includes a processor and computer-readable media that stores computer-executable instructions. The instructions cause the processor to determine a reserve level for a battery of a first device. The reserve level provides electrical power to the device to perform one or more functions. The instructions further cause the processor to enable the battery to supply power to a second device external to the first device responsive to a power level of the battery reaching the reserve level and disable the battery from supplying the power to the second device responsive to the power level of the battery falling below the reserve level.

In another illustrative embodiment, a system includes a first device having a battery and a control unit. The control unit includes a processor and computer-readable media that stores computer-executable instructions. The instructions cause the processor to determine a reserve level for a battery of a first device. The reserve level provides electrical power to the device to perform one or more functions. The instructions further cause the processor to enable the battery to supply power to a second device external to the first device responsive to a power level of the battery reaching the reserve level and disable the battery from supplying the power to the second device responsive to the power level of the battery falling below the reserve level.

In another illustrative embodiment, a method includes determining a reserve level for a battery of a first device that provides electrical power to the first device to perform one or more functions, enabling the battery to supply power to a second device external to the first device responsive to a power level of the battery reaching the reserve level, and disabling the battery from supplying the power to the second device responsive to the power level of the battery falling below the reserve level.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Illustrative embodiments are illustrated in referenced figures of the drawings. It is intended that the embodiments and figures disclosed herein are to be considered illustrative rather than restrictive.

DETAILED DESCRIPTION

Figure 1:
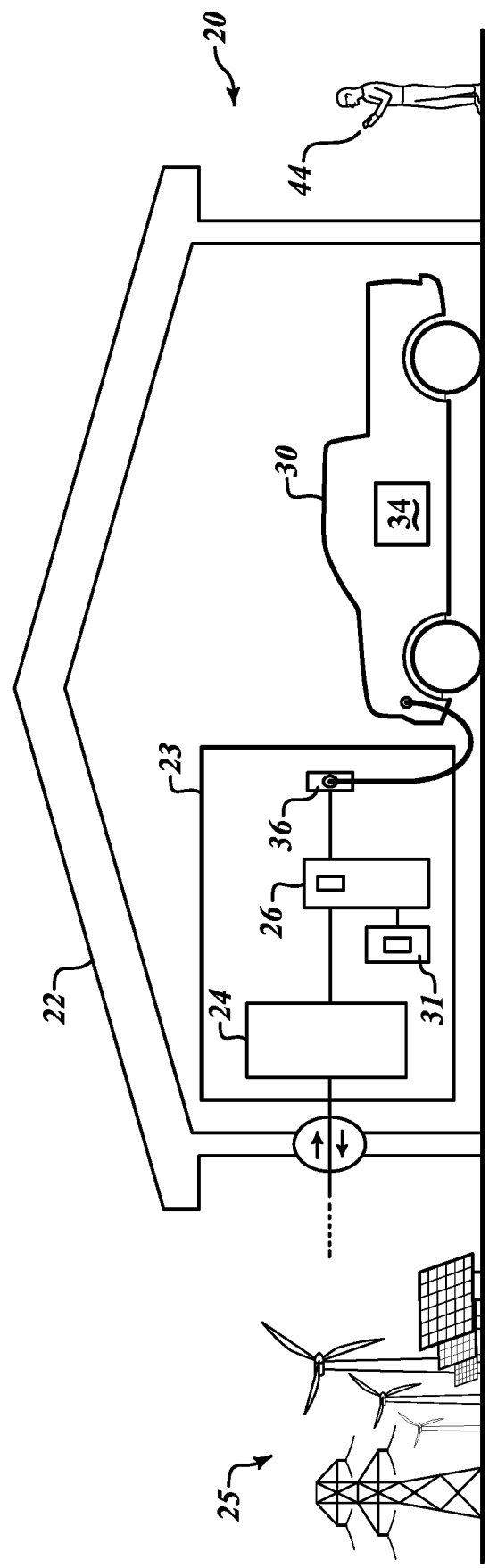
FIG. 1 is a schematic diagram of an illustrative vehicle charging/discharging environment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Various disclosed embodiments include illustrative control units, systems, and methods. As will be explained below, such embodiments can establish/dynamically adjust reserve power limits for a battery.

Figure 2:
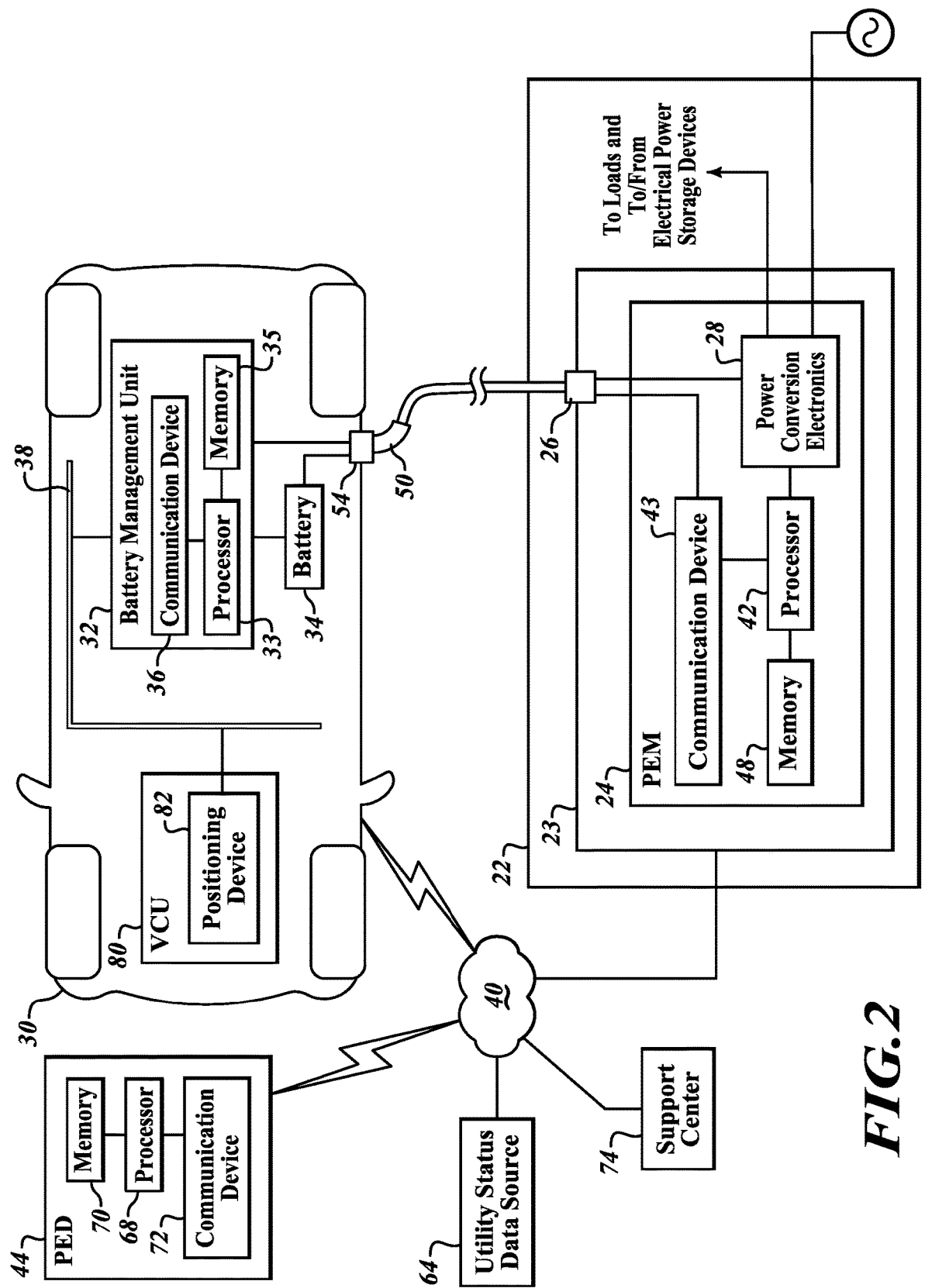
FIG. 2 is a block diagram in partial schematic form of illustrative components of the vehicle charging/discharging environment of FIG. 1.

Given by way of non-limiting overview and referring to FIGS. 1 and 2, in various embodiments a system 20 that dynamically establishes reserve power limits for a battery for a vehicle for allowing usage if needed during an event, such as a power outage. The system 20 includes a first device, such as a vehicle 30, including a battery 34 and a control unit, such as a battery management unit (BMU) 32. The BMU 32 includes a processor 33 and non-transitory computer-readable media, such as memory 35, configured to store computer-executable instructions. The instructions are configured to cause the processor 33 to determine or establish a reserve level for the battery 34 of the vehicle 30. The reserve level is chosen to provide sufficient electrical power to enable the vehicle 30 to achieve a function. The instructions are further configured to cause the processor 33 to enable the battery 34 to function as a power supply configured to provide electrical power for a second device, such as a structure 22, external to the vehicle 30 responsive to a power level of the battery 34 exceeding the reserve level. The instructions are still further configured to cause the processor 33 to disable use of the battery 34 as the power supply for the structure 22 responsive to the power level of the battery 34 being below the reserve level. It should be noted the processor 33 may determine one or more reserve levels, possibly configurable by a user. For example, a first reserve level for the battery 34 may enable the vehicle 30 to drive 25 miles over a given terrain, whereas a second reserve level for the battery 34 may enable the vehicle 30 to driver more than 25 miles over the given terrain. In another example, the first reserve level for the battery 34 may enable the vehicle 30 to drive 25 miles over a given terrain within a first temperature range (e.g., 55-75 degrees Fahrenheit), whereas the second reserve level for the battery 34 may enable the vehicle 30 to driver more than 25 miles over the given terrain within a second temperature range (e.g., 40-90 degrees). As such, it should be noted that the reserve levels may be automatically configured based on air temperatures in the first temperature range and/or the second temperature range.

Now that an overview has been presented by way of illustration only and not of limitation, details will be set forth by way of non-limiting examples given by way of illustration only and not of limitation. First, the illustrative system 20 will be explained by way of non-limiting examples given by way of illustration only. Then, illustrative processes for establishing/dynamically adjusting reserve power limits for a battery will be explained by way of non-limiting examples given by way of illustration only.

As shown in FIGS. 1 and 2, in various embodiments the illustrative system 20 is configured to establish/dynamically alter a reserve power level for the battery 34 located in the vehicle 30. The system 20 may include the BMU 32 and the battery 34. The system 20 may also include or be in data communication with a personal electronics device (PED) 44, a bidirectional power electronics system 23 located at the structure 22, and a utility status data source 64 located remotely from the vehicle 30 and the structure 22. The structure 22 may be a residential structure, such as a house, a townhouse, a condominium, an apartment building, or the like, or a business structure such as an office building, a store, a factory, a warehouse, a hospital, or the like, or any other structure with an electrical system capable of connecting to a grid alternating current (AC) supply 25 or other external energy supply/source.

In various embodiments, the grid AC supply 25 may provide AC electrical power from a variety of different devices, such as wind turbine, solar cell, geothermal, nuclear power plants, hydro-electric power plants, natural gas power plants, coal-run power plants, or any mechanism that can produce AC electrical power.

Given by way of non-limiting example, in various embodiments the vehicle 30 may be an electric vehicle (that is, an all-electrically driven vehicle) or a hybrid vehicle. For example and given by way of non-limiting examples, in various embodiments the vehicle may include a motor vehicle driven by wheels and/or tracks, such as, without limitation, an automobile, a truck, a sport utility vehicle (SUV), a van, an all-terrain vehicle (ATV), a motorcycle, an electric bicycle, a tractor, a lawn mower such as without limitation a riding lawn mower, a snowmobile, and the like. Given by way of further non-limiting examples, in various embodiments the vehicle 30 may include a marine vessel such as, without limitation, a boat, a ship, a submarine, a submersible, an autonomous underwater vehicle (AUV), and the like. Given by way of further non-limiting examples, in various embodiments the vehicle 30 may include an aircraft such as, without limitation, a fixed wing aircraft, a rotary wing aircraft, and a lighter-than-air (LTA) craft.

In various embodiments and given by way of example only and not of limitation, the battery 34 suitably includes high energy rechargeable batteries that store electrical charge, discharge electrical current upon request, and recharge. The rechargeable batteries may be structured in any desirable form, such as without limitation cylindrical, pouch, prismatic, massless, or other comparable forms. In various embodiments the rechargeable batteries may include Iron-air batteries, Li-ion batteries, such as without limitation Nickel Cobalt Aluminium, Lithium Manganese Cobalt, or Lithium Manganese Oxide batteries. However, other materials may be used that provide comparable recharging, energy density, and energy discharge capabilities.

As shown in FIG. 2, in various embodiments the BMU 32 may include the processor 33, a communication device 36, and the memory 35. The memory 35 stores computer-executable instructions configured to cause the processor 33 to perform various battery management functions such as, without limitation, determining state of charge, determining battery temperature, collecting and analyzing other battery information, and the like. The communication device 36 may send the assessed battery information to a power electronics module (PEM) 24. Charging information produced by the PEM 24 may be sent back to the respective BMU 32 via the same connection.

In various embodiments the bidirectional power electronics system 23 includes components for receiving the AC electrical power from the grid AC supply 25, supplying the AC electrical power to electrical loads of the structure 22, and converting the AC electrical power to direct current (DC) electrical power for charging various devices. In various embodiments the bidirectional power electronics system 23 may include a charging unit 26 and the PEM 24. The PEM 24 performs bidirectional conversion between the AC electrical power to DC electrical power. The DC electrical power may be used for charging DC storage devices.

In various embodiments the PEM 24 includes power conversion electronics 28, a second processor 42, a non-transitory computer readable media (second memory 48), and a second communication device 43. In various embodiments the bidirectional power electronic system 23 may include other components, such as a power meter, circuit breakers, backup electrical power generation devices and electrical power storage devices 31, a battery, or the like.

In various embodiments the charging unit 26 provides a power and communication connection between the battery 34 and the PEM 24. In various embodiments the charging unit 26 suitably includes a charging cord 50 that electrically connects to the battery 34 and the BMU 32 via a charging port 54 of the vehicle 30. In various embodiments the charging port 54 includes DC electrical power leads and communication leads that allow for transmission of DC electrical power between the battery 34 and the power conversion electronics 28 and for transmission of data and instructions between the processors 33 and 42 and the communication devices 36 and 43 in accordance with a communication protocol, such as, without limitation, the Combined Charging System (CCS) protocol, the CHAdeMO protocol, or other charger protocols.

In various embodiments the second memory 48 is configured to store computer-executable instructions. Responsive to the stored instructions, the second processor 42 is configured to receive information from the vehicle 30 and send information/instructions to the power conversion electronics 28 for providing electrical power to the battery 34 via the charging unit 26, the charging cord 50, and the charging port 54.

In various embodiments and given by way of example only and not of limitation, the power conversion electronics 28 may include an AC-DC bidirectional inverter device and multiple DC-DC converters that are configured according to the device they are to be connected to. The AC-DC bidirectional inverter device converts AC received from the AC electrical power source to DC and converts DC received from the energy storage device 31 and the battery 34 back to AC. Bidirectional inverters and DC-DC converters are extremely well known in the art and no further explanation is necessary for a person of skill in the art to understand disclosed subject matter.

In various embodiments, the illustrative vehicle 30 may include a vehicle control unit (VCU) 80, the BMU 32, the battery 34, and the charging port 54. In various embodiments the VCU 80 provides usage information to the processor 33 regarding destinations where the vehicle 30 has traveled in the past. In various embodiments the VCU 80 may include a positioning device 82, such as a global positioning system (GPS), a global navigation satellite system (GNSS), or the like. The data produced by the GPS and/or the GNSS is analyzed either at the VCU 80, the processor 33, or sent to other components for analysis to determine historical driving information (usage information). The historical driving information may include driving patterns, user information associated with the vehicle 30 and/or the driving patterns, date and time information associated with the driving patterns, and the like. The driving patterns may include frequently visited destinations away from the structure 22 and those destinations where charging may have occurred. Positioning devices are well known in the art and no further explanation is necessary for a person of skill in the art to understand the disclosed subject matter.

In various embodiments the BMU 32 may communicate with the VCU 80 and with numerous other vehicle components via a network 38, such as a network bus, like a peer-to-peer network bus such as a controller area network (CAN) bus. Other network buses, such as a local area network (LAN), a wide area network (WAN), or a value-added network (VAN), may also be used for enabling communication between the components connected to the network 38.

In various embodiments the PED 44 provides operational information to a user regarding the battery 34 and the established reserve level. The PED 44 may be a smartphone, tablet, smartwatch, or any device capable of providing information to a user. In various embodiments the PED 44 may include a third processor 68, a non-transitory computer readable media (third memory 70), and a third communication device 72. The PED 44 may include application programs configured to receive battery reserve level information to the processors 33 and 42 via a data network 40 and the communication devices 36, 43, and 72. The data network 40 may be a public or private data network, such as without limitation a cellular network, a local area network (LAN), a wide area network (WAN), or the like.

In various embodiments the utility status data source 64 provides status of utility services. The utility status data source 64 may be a processing system operated by an entity that operates the AC grid power source or an entity capable of gathering status of utility services information. The status of utility services information may include information identifying map areas included in a power outage, estimated power outage restoration information, or the like.

In various embodiments the processing described herein for dynamically establishing/adjusting reserve level the battery 34 may be performed at or distributed between any of the processing locations, such as, without limitation, the processors 33, 42, and 68 and the VCU 80 that is in communication with whatever device, such as, without limitation, the BMU 32 or the PEM 24, control charging of the battery 34. As discussed herein, in various embodiments the processors 33, 42, and 68 suitably may include computer processors, data processors, or the like, that are configured to execute instructions received from external sources or stored in local memory 35, 48, and 70.

As discussed herein, in various embodiments the memory 35, 48, and 70 include non-transitory computer-readable storage medium that include computer-readable code (instructions) stored thereon for causing the respective processors 33, 42, and 68 to perform functions as described and claimed herein. Examples of such computer-readable storage mediums include, but are not limited to, a hard disk, an optical storage device, a magnetic storage device, a Read-Only Memory (ROM), a Programmable Read-Only Memory (PROM), an Erasable Programmable Read-Only Memory (EPROM), an Electrically Erasable Programmable Read-Only Memory (EEPROM), flash memory, and the like. When stored in the non-transitory computer-readable medium, software can include the instructions executable by the respective processors 33, 42, and 68 that, in response to such execution, causes performance of a set of operations, steps, methods, processes, algorithms, functions, techniques, etc. as described herein for the various embodiments.

In various embodiments the communication devices 36, 43, and 72 may include any suitable wired or wireless device (such as a transceiver or the like) configured to communicate with the other communication devices using various network access devices, methods, and/or protocols, such as, without limitation, a wireless (WiFi, Bluetooth) connection with a network portal/modem/router, a wired or wireless connection, or the like.

Now that the system 20 has been described, illustrative processes for establishing/dynamically adjusting reserve power limits for a battery will be explained by way of non-limiting examples given by way of illustration only.

The BMU 32 is used to dynamically establish and/or adjust a reserve battery level responsive to vehicle usage information, thus providing the vehicle 30 has reserve power for travelling to selected destinations that may not be affected by a power outage event. In various embodiments the instructions are further configured to cause the processor 33 to receive the usage information for the vehicle 30 from the VCU 80. Then, the instructions cause the processor 33 to establish the reserve level responsive to the usage information.

In various embodiments the BMU 32 may relay capacity of the battery 34 to the processor 42 of the PEM 24, which acts as an energy control unit. The processor 42 communicates the battery capacity information to a support center 74 via the network 40. The support center 74 may also receive the historical driving information from the VCU 80 via the network 40. The support center 74 may include an application program configured to determine the reserve level responsive to the received information and communicate the reserve level back to the vehicle 30 and/or the PEM 24. The support center 74 may also receive/determine weather information and determine the reserve level responsive to the weather information. For example, the weather information may indicate weather and/or temperature that might require more battery power to get to a target location than driving to the same target location on a clear weather day.

In various embodiments the instructions are further configured to cause the processor 33 to filter the received usage information to include a location(s), which the vehicle 30 has visited responsive to a threshold value. The filtering may include removing trips, destinations, events, or the like that occur outside of the threshold value. The threshold value may be a time value, a distance value, a charging power value, if the destination is associated with the charging device, or the like. Then, the instructions cause the processor 33 to establish the reserve level further responsive to the filtered usage information.

In various embodiments the usage information may include user information, time, the day of the week, travel location information, or the like. The travel location information may include destination, battery recharging information, a learned driving pattern for the vehicle 30 and/or charging history information, or other operational information. The charging history information may include locations where the vehicle 30 has been charged, how much chare was given to the battery 34 during each charging event, or the like.

In various embodiments the instructions are further configured to cause the processor 33 to receive information identifying a grid outage area from the utility status data source 64 via the data network 40. The instructions are further configured to cause the processor 33 to select a target location outside of the grid outage area or inside the grid outage area if the target location has a charging unit powered by a non-grid power source, such as, without limitation, solar panels, wind turbines, generator, geothermal, or the like. The target location may be a location chosen from the usage information, the charging history information, a list of other charging devices located outside the grid outage area or inside the grid outage area if powered by a non-grid power source. Then, the instructions cause the processor 33 to determine an amount of energy needed to get the vehicle 30 to the target location and establish the reserve level further responsive to the determined amount of energy.

In various embodiments the received usage information may include calendared activity information associated with a user(s) of the vehicle 30. The calendared activity information may be included in a calendar application program accessible by the VCU 80 and/or the PED 44. The instructions are further configured to cause the processor 33 to establish the reserve level further responsive to the calendared activity information. In a nonlimiting example, the calendared activity information may indicate an upcoming road trip to a destination requiring greater amount of battery power.

Figure 3:
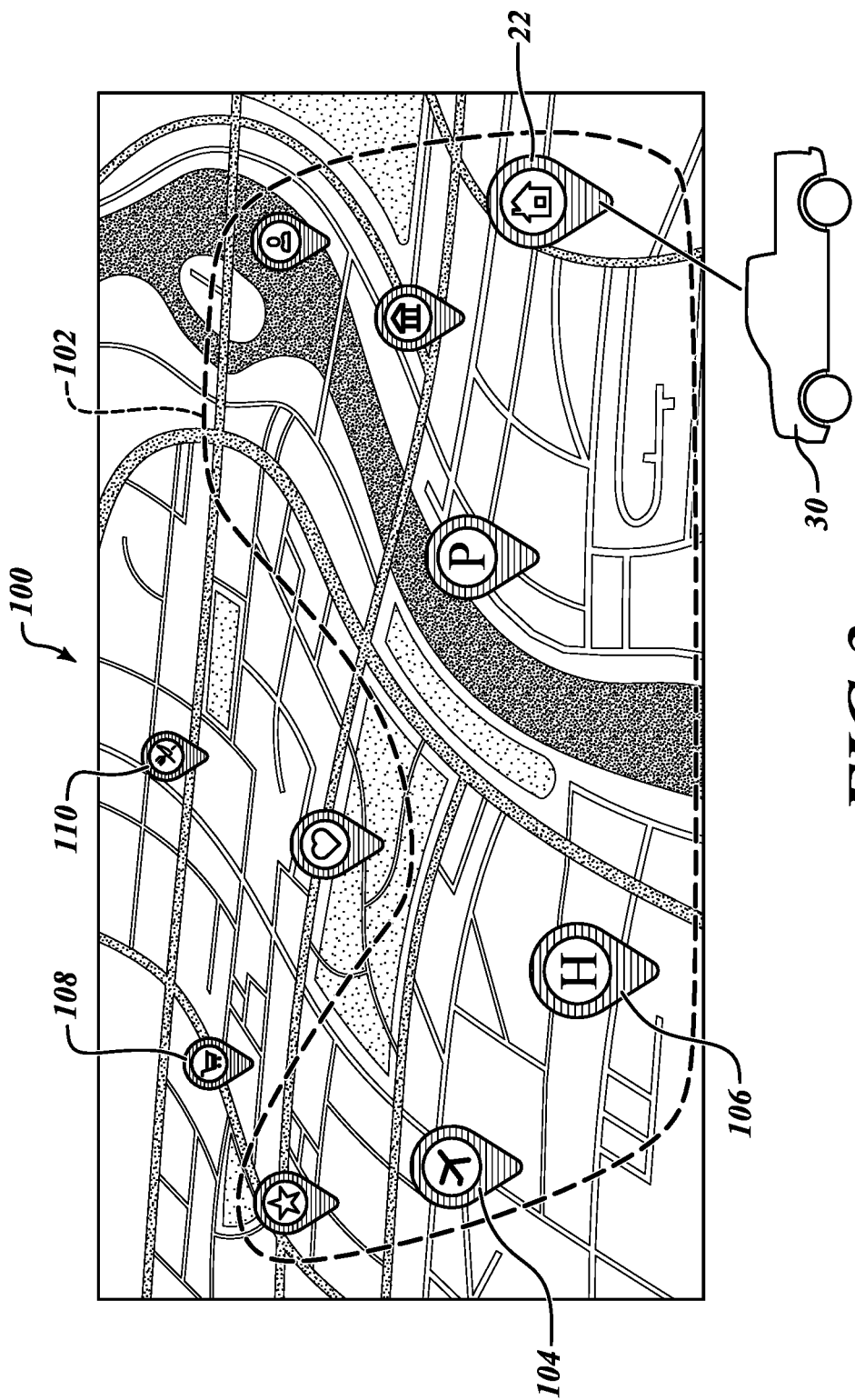
FIG. 3 is a schematic diagram of illustrative map information analyzed by the system of FIGS. 1 and 2.

In various embodiments the usage information produced by the positioning device 82 includes location information for various destinations visited or those including services, such as, without limitations, charging units. As shown in FIG. 3, in various embodiments an illustrative map 100 is a graphical representation of a type of analysis performed by the system 20, whereby the usage information is compared to grid outage information to determine potential target destinations the vehicle 30 may travel. The determined potential target destinations is used by the processor 33 to establish a reserve battery limit (reserve level) for the associated battery 34. In various embodiments the map 100 suitably includes multiple target locations (such as, given by way of non-limiting examples, an airport 104, a hospital 106, a grocery store 108, a restaurant 110, and other locations) determined by the processor 33 responsive to receiving usage information from the positioning device 82. The utility status data source 64 sends information identifying a power grid outage area 102. The utility status data 64 may also send information estimating a time of when the power grid outage area 102 will return to full service. In this example, if the usage information of the vehicle 30 indicates that the vehicle 30 leaves the associated home (the structure 22) to the hospital 106 every Monday through Friday, the processor 33 may determine that the reserve level for the battery 34 of the vehicle 30 should be high enough for the battery 34 to get the vehicle 30 to the hospital 106 or to another location that the usage information indicates the vehicle 30 often travels to, such as a fast charger or the grocery store 108 where battery chargers are located and have been used by the vehicle 30 in the past. The locations outside of the dotted line area show filtered usage information.

Figure 4:
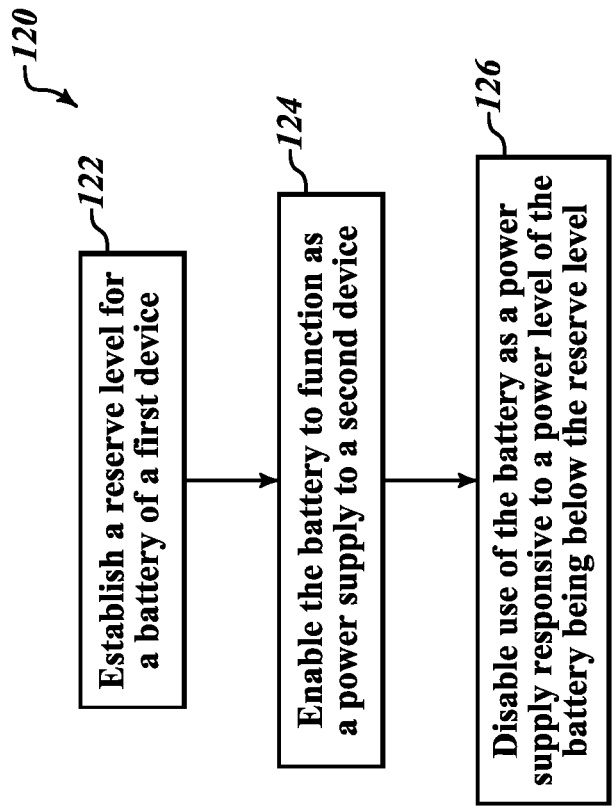
FIG. 4 is a flow diagram of an illustrative method performed for establishing reserve power limits for a vehicle's battery.

Referring additionally to FIG. 4, in various embodiments an illustrative process 120 is provided for by a control unit executing instructions stored in a memory. At a block 122, a reserve level for a battery of a first device is established. At a block 124, the battery is enabled to function as a power supply for a second device provided the power level of the battery is higher than the reserve level. At a block 126, the battery is disabled as a power supply to the second device responsive to the power level of the battery being below the reserve level.

Figure 5:
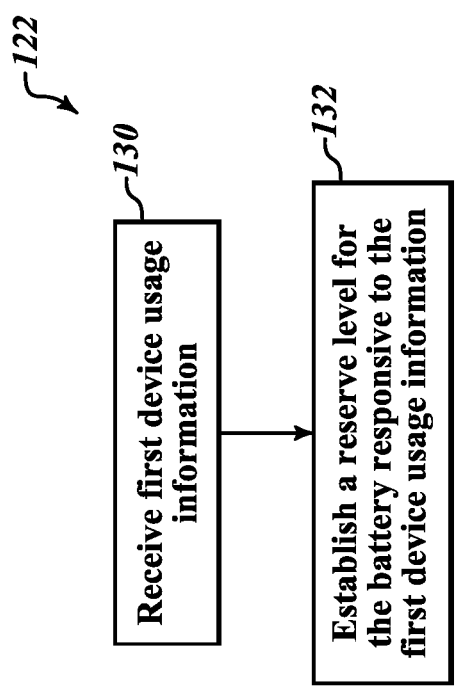

Referring additionally to FIG. 5, additional illustrative details will be explained regarding portions of the process 120. For example, in various embodiments the process performed at the block 122 (FIG. 4) may be expanded upon. In some such embodiments, at a block 130, usage information for the first device is receive. At a block 132, the reserve level is established responsive to the first device usage information.

Figure 6:
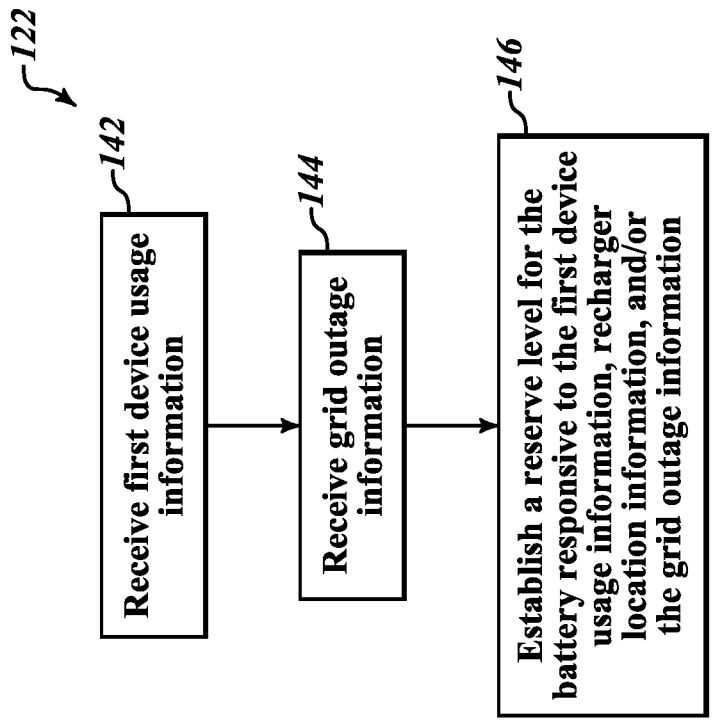
FIGS. 5 and 6 are flow diagrams of details of the method of FIG. 4. Like reference symbols in the various drawings generally indicate like elements.

Referring additionally to FIG. 6, additional illustrative details will be explained regarding portions of the process 120. For example, in various embodiments the process performed at the block 122 (FIG. 4) may be expanded upon. In some such embodiments, at a block 142, usage information for the first device is receive. At a block 144, grid outage information is received. At a block 146, the reserve level is established responsive to the first device usage information, charger location information, and/or the grid outage information.

Those skilled in the art will recognize that at least a portion of the controllers, devices, units, and/or processes described herein can be integrated into a data processing system. Those having skill in the art will recognize that a data processing system generally includes one or more of a system unit housing, a video display device, memory such as volatile or non-volatile memory, processors such as microprocessors or digital signal processors, computational entities such as operating systems, drivers, graphical user interfaces, and applications programs, one or more interaction devices (e.g., a touch pad, a touch screen, an antenna, etc.), and/or control systems including feedback loops and control motors (e.g., feedback for sensing position and/or velocity; control motors for moving and/or adjusting components and/or quantities). A data processing system may be implemented utilizing suitable commercially available components, such as those typically found in data computing/communication and/or network computing/communication systems.

The term controller/processor, as used in the foregoing/following disclosure, may refer to a collection of one or more components that are arranged in a particular manner, or a collection of one or more general-purpose components that may be configured to operate in a particular manner at one or more particular points in time, and/or also configured to operate in one or more further manners at one or more further times. For example, the same hardware, or same portions of hardware, may be configured/reconfigured in sequential/parallel time(s) as a first type of controller (e.g., at a first time), as a second type of controller (e.g., at a second time, which may in some instances coincide with, overlap, or follow a first time), and/or as a third type of controller (e.g., at a third time which may, in some instances, coincide with, overlap, or follow a first time and/or a second time), etc. Reconfigurable and/or controllable components (e.g., general purpose processors, digital signal processors, field programmable gate arrays, etc.) are capable of being configured as a first controller that has a first purpose, then a second controller that has a second purpose and then, a third controller that has a third purpose, and so on. The transition of a reconfigurable and/or controllable component may occur in as little as a few nanoseconds, or may occur over a period of minutes, hours, or days.

In some such examples, at the time the controller is configured to carry out the second purpose, the controller may no longer be capable of carrying out that first purpose until it is reconfigured. A controller may switch between configurations as different components/modules in as little as a few nanoseconds. A controller may reconfigure on-the-fly, e.g., the reconfiguration of a controller from a first controller into a second controller may occur just as the second controller is needed. A controller may reconfigure in stages, e.g., portions of a first controller that are no longer needed may reconfigure into the second controller even before the first controller has finished its operation. Such reconfigurations may occur automatically, or may occur through prompting by an external source, whether that source is another component, an instruction, a signal, a condition, an external stimulus, or similar.

For example, a central processing unit/processor or the like of a controller may, at various times, operate as a component/module for displaying graphics on a screen, a component/module for writing data to a storage medium, a component/module for receiving user input, and a component/module for multiplying two large prime numbers, by configuring its logical gates in accordance with its instructions. Such reconfiguration may be invisible to the naked eye, and in some embodiments may include activation, deactivation, and/or re-routing of various portions of the component, e.g., switches, logic gates, inputs, and/or outputs. Thus, in the examples found in the foregoing/following disclosure, if an example includes or recites multiple components/modules, the example includes the possibility that the same hardware may implement more than one of the recited components/modules, either contemporaneously or at discrete times or timings. The implementation of multiple components/modules, whether using more components/modules, fewer components/modules, or the same number of components/modules as the number of components/modules, is merely an implementation choice and does not generally affect the operation of the components/modules themselves. Accordingly, it should be understood that any recitation of multiple discrete components/modules in this disclosure includes implementations of those components/modules as any number of underlying components/modules, including, but not limited to, a single component/module that reconfigures itself over time to carry out the functions of multiple components/modules, and/or multiple components/modules that similarly reconfigure, and/or special purpose reconfigurable components/modules.

In some instances, one or more components may be referred to herein as "configured to," "configured by," "configurable to," "operable/operative to," "adapted/adaptable," "able to," "conformable/conformed to," etc. Those skilled in the art will recognize that such terms (for example "configured to") generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (for example, bodies of the appended claims) are generally intended as "open" terms (for example, the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (for example, "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (for example, the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software (e.g., a high-level computer program serving as a hardware specification), firmware, or virtually any combination thereof, limited to patentable subject matter under 35 U.S.C. 101. In an embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, limited to patentable subject matter under 35 U.S.C. 101, and that designing the circuitry and/or writing the code for the software (e.g., a high-level computer program serving as a hardware specification) and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

With respect to the appended claims, those skilled in the art will appreciate that recited operations therein may generally be performed in any order. Also, although various operational flows are presented in a sequence(s), it should be understood that the various operations may be performed in other orders than those which are illustrated or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

While the disclosed subject matter has been described in terms of illustrative embodiments, it will be understood by those skilled in the art that various modifications can be made thereto without departing from the scope of the claimed subject matter as set forth in the claims.

What is claimed is:

1. A control unit comprising:
a processor; and
non-transitory computer-readable media configured to store computer-executable instructions configured to cause the processor to:
determine a reserve level for a battery of a first device, the reserve level configured to provide electrical power to the device to perform one or more functions;
determine information chosen from usage information for the first device and weather information;
determine the reserve level responsive to the information;
filter the received usage information to include at least one location which the first device has visited more than a threshold amount;
determine the reserve level further responsive to the filtered usage information;
enable the battery to supply power to a second device external to the first device responsive to a power level of the battery reaching the reserve level; and
disable the battery from supplying the power to the second device responsive to the power level of the battery falling below the reserve level.

2. The control unit of claim 1, wherein the usage information includes charging history information.

3. The control unit of claim 2, wherein the instructions are further configured to cause the processor to:
receive information identifying a grid outage area;
select a target location outside of the grid outage area, the target location being a location chosen from the charging history information and a recharge location located outside the grid outage area;
determine an amount of power needed to get the first device to the target location; and
determine the reserve level further responsive to the determined amount of power.

4. The control unit of claim 2, wherein the charging history information includes at least one learned driving pattern for the first device.

5. The control unit of claim 1, wherein:
the received usage information includes calendared activity information associated with at least one user of the first device; and
the instructions are further configured to cause the processor to determine the reserve level further responsive to the calendared activity information.

6. A system comprising:
a first device including a battery; and
a control unit including:
a processor; and
non-transitory computer-readable media configured to store computer-executable instructions configured to cause the processor to:
determine a reserve level for a battery of a first device, the reserve level configured to provide electrical power to the device to perform one or more functions;
filter the received usage information to include at least one location which the first device has visited more than a threshold amount; and
determine the reserve level further responsive to the filtered usage information;
enable the battery to supply power to a second device external to the first device responsive to a power level of the battery reaching the reserve level; and
disable the battery from supplying the power to the second device responsive to the power level of the battery falling below the reserve level.

7. The system of claim 6, wherein the instructions are further configured to cause the processor to:
  determine information chosen from usage information for the first device and weather information; and
  determine the reserve level responsive to the information.

8. The system of claim 7, wherein the usage information includes charging history information.

9. The system of claim 8, wherein the instructions are further configured to cause the processor to:
  receive information identifying a grid outage area;
  select a target location outside of the grid outage area, the target location being a location chosen from the charging history information and a recharge location located outside the grid outage area;
  determine an amount of power needed to get the first device to the target location; and
  determine the reserve level further responsive to the determined amount of power.

10. The system of claim 8, wherein the charging history information includes at least one learned driving pattern for the first device.

11. The system of claim 7, wherein:
  the received usage information includes calendared activity information associated with at least one user of the first device; and
  the instructions are further configured to cause the processor to determine the reserve level further responsive to the calendared activity information.

12. A method comprising:
  determining a reserve level for a battery of a first device, the reserve level configured to provide electrical power to the first device to perform one or more functions;
  determining information chosen from usage information for the first device and weather information; and
  determining the reserve level responsive to the information, wherein determining the reserve level includes;
    receiving information identifying a grid outage area;
    selecting a target location outside of the grid outage area, the target location being a location chosen from the at least one location, which the first device has visited more than a threshold amount, and a recharge location located outside the grid outage area;
    determining an amount of power needed to get the first device to the target location; and
    determining the reserve level further responsive to the determined amount of power; and
  enabling the battery to supply power to a second device external to the first device responsive to a power level of the battery reaching the reserve level; and
  disabling the battery from supplying the power to the second device responsive to the power level of the battery falling below the reserve level.

13. The method of claim 12, wherein the usage information includes charging history information.

14. The method of claim 13, wherein the charging history information includes at least one learned driving pattern for the first device.

15. The method of claim 12, wherein:
  the received usage information includes calendared activity information associated with at least one user of the first device; and
  establishing further includes establishing the reserve level further responsive to the calendared activity information.

* * * * *